United States Patent [19]
Kaloyeros et al.

[11] Patent Number: 6,139,922
[45] Date of Patent: Oct. 31, 2000

[54] TANTALUM AND TANTALUM-BASED FILMS FORMED USING FLUORINE-CONTAINING SOURCE PRECURSORS AND METHODS OF MAKING THE SAME

[75] Inventors: Alain E. Kaloyeros, Slingerlands, N.Y.; Barry C. Arkles, Dresher, Pa.

[73] Assignees: Gelest, Inc., Tullytown, Pa.; The Research Foundation of State University of New York, Albany, N.Y.

[21] Appl. No.: 09/313,618

[22] Filed: May 18, 1999

[51] Int. Cl.$^7$ .......................... C23C 16/08; H01L 21/44
[52] U.S. Cl. .................. 427/576; 427/578; 427/253; 427/255; 427/255.7; 438/682; 438/683; 438/685
[58] Field of Search ................... 427/576, 578, 427/253, 255, 255.7; 438/682, 683, 685

[56] References Cited

U.S. PATENT DOCUMENTS

| | | | |
|---|---|---|---|
| 2,820,722 | 1/1958 | Fletcher | 117/7 |
| 4,504,521 | 3/1985 | Widmer et al. | 427/85 |
| 4,608,271 | 8/1986 | Hieber et al. | 427/38 |
| 5,149,514 | 9/1992 | Sanjurjo | 423/344 |
| 5,175,017 | 12/1992 | Kobayashi et al. | 427/8 |
| 5,919,531 | 7/1999 | Arkles et al. | 427/576 |

OTHER PUBLICATIONS

Chen, et al., "Low Temperature Plasma–Promoted Chemical Vapor Deposition Of Tantalum From Tantalum Pentabromide For Copper Metallization," *J. Vac. Sci. Technol. B.*, 16(5):2887–2890 (1998), No Month.

Chen, et al., "Low–Temperature Chemical Vapor Deposition Of Tantalum Nitride From Tantalum Pentabromide For Integrated Circuitry Copper Metallization Applications," *J. Mater. Res.*, 14(5):2043–2052 (1999), No Month.

Faltermeier, et al., "Barrier Properties Of Titanium Nitrade Films Grown By Low Temperature Chemical Vapor Deposition From Titanium Tetraiodide," *J. Electrochem. Soc.*, 144(3):1002–1008 (1997), No Month.

Takeo Oku et al., "Thermal Stability of WN$_x$ and TaN$_x$ Diffusion Barriers Between Si and Cu," Proceedings of the 12th International VLSI Multilevel Interconnection Conference (VMIC, Tampa, Florida) (1995), pp. 182–185, No Month.

S.C. Sun et al., "A Comparative Study of CVD TiN and CVD TaN Diffusion Barriers for Copper Interconnection," Proceedings of the IEDM, (1995), pp. 461–464, No Month.

S.C. Sun et al., "Diffusion Barrier Properties of CVD Tantalum Nitride for Aluminum and Copper Interconnections," Proceedings of the 12th International VLSI Multilevel Interconnection Conference (VMIC, Tampa, Florida) (1995), pp. 157–162, No Month.

L.A. Clevenger et al., "Comparison of High Vacuum and Barrier Performance Against Copper Penetration", *J. Appl. Phys.* vol 73, No. 1 (Jan. 1993), pp. 300–308.

Karen Holloway et al., "Tantalum as a Diffusion Barrier Between Copper and Silicon: Failure Mechanism and Effect of Nitrogen Additions," *J. Appl. Phys.* vol. 71, No. 11 (Jun. 1992), pp. 5433–5444.

(List continued on next page.)

*Primary Examiner*—John F. Niebling
*Assistant Examiner*—Alexander G. Ghyka
*Attorney, Agent, or Firm*—Akin, Gump, Strauss, Hauer & Feld L.L.P.

[57] ABSTRACT

A method for chemical vapor deposition of a film comprising tantalum onto a substrate includes introducing into a deposition chamber: (i) a substrate; (ii) a source precursor in the vapor state; and (iii) a reactant gas, and maintaining the temperature of the substrate within the chamber as from about 70° C. to about 675° C. for a period of time sufficient to deposit a film comprising tantalum on the substrate. The source precursor has a formula (I):

$$\text{Ta}(F_{5-q-p})(X_{q-p})(R_p) \qquad (I)$$

wherein X is selected from the group consisting of bromine, iodine, chlorine, and combinations thereof; q is an integer from 0 to 4; p is an integer from 0 to 4; and R is selected from the group consisting of hydrogen and lower alkyl.

30 Claims, 6 Drawing Sheets

OTHER PUBLICATIONS

Mayumi Takeyama, et al., "Properties of TaN$_x$ Films as Diffusion Barriers in the Thermally Stable Cu/Si Contact Systems", *J. Vac. Sci. Technol.*, vol. B14, No. 2 (Mar./Apr. 1996), pp. 674–678.

M.H. Kiang et al., "Planarized Copper Interconnects by Selective Electroless Plating," *Mat. Res. Soc. Symp. Proc.*, vol. 265 (1992), pp. 187–197, No Month.

S.P. Murarka et al., "Advanced Multilayer Metallization Schemes with Copper as Interconnection Metal", *Thin Solid Films*, vol. 236, (1993), pp. 257–266, No Month.

E. Kolawa et al., "Tantalum–Based Diffusion Barriers In Si/Cu VLSI Metallizations," *J. Appl. Phys.*, vol. 70, No. 3 (Aug. 1, 1991), pp. 1369–1373.

A. Katz et al., "Tantalum Nitride Films as Resistors on Chemical Vapor Deposited Diamond Substrates," *J. Appl. Phys.*, vol. 73, No. 10 (May 15, 1993).

Takehiko Takahashi et al., "Chemical Vapor Deposition of Tantalum Nitride Films," *Journal of the Less–Common Metals*, vol. 52 (1977), pp. 29–36, No Month.

Renaud Fix et al., "Chemical Vapor Deposition of Vanadium, Niobium, and Tantalum Nitride Thin Films," *Chem. Mater.*, vol. 5 (1993), pp. 614–619, No Month.

M. Seel et al., "*Ab initio* cluster study of the interation of fluorine and chlorine with the Si(111) surface," *The American Physical Society*, vol. 28, No. 4 (Aug. 1983), pp. 2023–2038, No Month.

"The National Technology Roadmap for Semiconductors," Semiconductor Industry Association, San Jose, CA (1994), pp. 10–15, 94–109, No Month.

D. Ugolini et al., "Photoelectron Spectroscopy studies of chemical vapor deposition of Ta from a TaF5 precursor on Si and SiO2 substrates", *J. Appl. Phys.* vol. 70 (1991), pp. 3899–3906, No Month.

J. Nucci et al., "In–Situ Analysis of the Microstructure of Thermally Treated Thin Copper Films," *Mat. Res. Soc. Symp. Proc.*, vol. 309, pp. 377–383, No Date.

D.P. Tracy et al., "Texture and Microstructure of Thin Copper Films," *Journal of Electronic Materials*, vol. 22, No. 6 (1993), pp. 611–616, No Month.

H. O. Pierson, Handbook of Chemical Vapor Deposition, (1992), pp. 98–102, No Month.

B. Armas et al.,Proc. Conf. Chem. Vap. Deposition Int. Conf., 5th, (1975), pp. 695–703, No Month.

Alain Kaloyeros et al., "Barrier Properties of TiN Films Grown by Low Temperature CVD from TiI$_4$", *J. Electro. Chem.*, (1997), No Month.

Alain Kaloyeros et al., "TaN$_x$ Films Grown by Inorganic Low Temperature TCVD: Diffusion Metal Properties in Copper Metallization", *J. Electro. Chem.*, (1999), No Month.

Alain Kaloyeros, "Low Temperature Plasma–Promoted Chemical Vapor Deposition Of Tantalum from Tantalum Pentabromide For Copper Metalization", *J. Vac. Sci. and Tech. B*, (1998), No Month.

TANTALUM AND TANTALUM-BASED FILMS FORMED USING FLUORINE-CONTAINING SOURCE PRECURSORS AND METHODS OF MAKING THE SAME

TITLE OF THE INVENTION

Tantalum and Tantalum-Based Films Formed Using Fluorine-Containing Source Precursors And Methods Of Making The Same

BACKGROUND OF THE INVENTION

The evolution of the computer integrated chip (IC) has been driven by the need to increase speed, performance, and functionality. The successful achievement of these objectives has required a radical change in chip architecture with the introduction of multilevel interconnect schemes which exploit the third (vertical) dimension in the chip in order to enhance device performance. This approach simultaneously minimizes any increase in overall interconnect line lengths and in chip size, or "real estate." These multilevel interconnect schemes are expected to average up to seven levels of interconnects within the next decade in what is commonly referred to as ultra-large scale integration (ULSI).

The changes in chip architecture have been accompanied by a continuing decrease in single device feature size in order to accommodate more devices per chip, leading to appreciable enhancement in chip functionality. In this respect, device features are expected to shrink from a nominal 0.5 $\mu$m today to less than 0.18 $\mu$m by the year 2000. However, the trend in decreasing feature size has encountered serious performance problems in terms of increased RC delay, where R is the resistance and C the capacitance, in interconnect structures.

Significant reduction in line resistance R could be achieved by replacing currently used metallization architecture, which consists of tungsten plugs and tungsten or aluminum interconnects, with a fully integrated copper based metallization scheme. Copper exhibits lower resistivity (bulk resistivity=1.68 $\mu$-ohm-cm) than aluminum and tungsten, which should yield up to 40% reduction in RC delay. It is also predicted to display enhanced electromigration and stress resistance, thus leading to higher reliability and improved performance.

However, a major problem in the realization of such structurally-stable, copper-based metallization architectures is the identification of an appropriate diffusion barrier and adhesion promoter which provides the performance required in sub-quarter-micron device technologies. Copper is known to be highly reactive with and a fast diffuser in silicon. Its presence in silicon leads to the formation of deep trap levels which ruin device performance. Currently titanium and titanium nitride technology is used, but is not expected to deliver the performance required, given the need for increasingly thinner liners, in order to maximize space availability for the actual conductor in the continuously shrinking device structures. Additionally, adhesion of copper to prior art titanium nitride diffusion barriers and adhesion promoters has been known to be problematic, especially if the titanium nitride has been exposed to air prior to the copper deposition step.

Tantalum-based compounds provide a potential solution to these problems. Tantalum and its binary and ternary nitrides are highly refractory materials which are stable to extremely high temperatures and which are known to be nonreactive with copper. Copper-tantalum contacts have a demonstrated stability up to 550° C., with the motion of copper being extremely slow through tantalum at the typical temperatures used in microelectronic device fabrication. Additionally, tantalum-based nitrides have even higher melting points than tantalum. Tantalum nitrides exhibit high melting points, for example, TaN and Ta$_2$N have melting points of 2050° C. and 3087° C., respectively. These properties have led to the successful demonstration of sputtered tantalum nitrides as good diffusion barriers for copper-based technology, with proven copper-tantalum contact stability to temperatures as high as 750° C.

More importantly, the need for increasingly thinner liners make tantalum-based alloys inherently more desirable than their titanium counterparts. This may be because tantalum is a heavier (larger) ion than titanium, and accordingly tantalum-based alloys should provide the diffusion barrier performance required in ULSI structures at liner thicknesses which are significantly reduced in comparison with those of titanium alloys. The enhanced performance at reduced liner thicknesses ensures maximization of the useful space available for aluminum or copper conductors in the continuously shrinking device structures.

In this respect, ternary tantalum alloys, such as TaN$_x$Si$_y$, where x is greater than 0 and less than or equal to 2 and y is greater than 0 and less than or equal to 3, might be highly desirable in view of their unique structural properties. Not only do these compounds share the excellent diffusion barrier characteristics of their binary tantalum counterparts, but they also could be grown in amorphous form. The formation of the amorphous phase would eliminate the existence of grain boundaries, thereby preventing any potential metal, e.g. copper, diffusion pathways along such boundaries, and enhancing the barrier properties of the resulting TaN$_x$Si$_y$ phase.

One important application of pure tantalum is its ability to getter oxygen. As such, it provides a stable ohmic contact when deposited directly on silicon and alloyed to it to form a tantalum silicide, TaSi$_y$, phase with y being greater than zero and possibly less than or equal to 3. Traditionally, the formation of the tantalum silicide phase involves the deposition of pure tantalum on silicon, then either a single anneal or multiple anneals at high temperature (as high as 900° C.) to form the silicide phase. However, as semiconductor device sizes become smaller than a quarter of a micron, the consumption of silicon from the substrate in the silicidation process becomes highly undesirable and quite problematic, leading to contact reliability concerns, as well as possible current leakage and device performance issues. Clearly, a need exists for the development of deposition processes for the growth of tantalum silicide directly from the vapor phase, without the need for silicon consumption from the underlying substrate.

At present, tantalum and its binary and ternary nitrides are grown by conventional sputtering techniques. These techniques, unfortunately, are inherently incapable of conformal step coverage in aggressive trench and via structures, given their line of sight approach to metal deposition. Therefore, alternate processing techniques are required for growing tantalum-based films for applications in sub-quarter-micron devices. In this respect, chemical vapor deposition (CVD) is one of the most promising techniques. CVD displays an intrinsic potential for conformal coverage of aggressive via and hole structures, in view of its ability to use the substrate surface as a catalyst for the deposition reaction. In addition, CVD has a proven ability to deposit pure and doped materials at industrially viable growth rates over large substrate areas, such as a standard 200 mm wafer size which is currently used in the semiconductor industry.

Numerous CVD approaches have already been tested for the growth of tantalum and its nitrides. Inorganic CVD using tantalum pentachloride (TaCl$_5$) in a hydrogen, nitrogen, and argon atmosphere led to the deposition of TaN and Ta$_2$N at temperatures in the range of 700–1000° C. See T. Takahashi, H. Itoh, and S. Ozeki, J., *Less-Common Met*, vol. 52, 29 (1977). Clearly, the high processing temperatures required prohibit the use of this deposition methodology in actual semiconductor devices. The high temperature is required to ensure complete dissociation of the tantalum-chlorine bonds in TaCl$_5$, and the subsequent reaction with ammonia to produce the nitride phase. Clearly, these high processing temperatures prohibit the use of such a CVD tantalum pentachloride-based deposition methodology in actual semiconductor devices. In addition, the inclusion of small amounts of chlorine (up to 5 at %) in the tantalum-based films is highly problematic, given chlorine's mobility out of the resulting nitride phase and into the surrounding layers, which causes significant corrosion and reliability problems.

Organometallic CVD approaches have been attempted which include the use of homoleptic dialkylamido tantalum complexes, and tributyldiethyl tantalum type sources. See S. C. Sun, M. H. Tsai, H. T. Chiu, S. H. Chuang, and C. E. Tsai, *Proceedings of the IEDM*; S. C. Sun, M. H. Tsai, C. E. Tsai, and H. T. Chiu, *Proceedings of the 12 th International VLSI Multilevel Interconnection Conference* (VMIC, Tampa, Flo., 1995) p. 157; and R. Fix, R. G. Gordon, and D. M. Hoffman, *Chem. Mater.* vol. 5,614 (1993). However, the organometallic CVD-based deposition methods did not encounter much success for a variety of reasons. In the case of tantalum, the organometallic CVD route was unable to produce pure tantalum films which were free of carbon and oxygen contaminants. In the case of nitrides, the low vapor pressure of the sources used in some cases made the resulting organometallic CVD process production unworthy, while the relative instability and short shelf life of the precursors used in some other cases created difficulties in transport, handling and storage.

However, none of the above approaches has led to the identification of an organometallic CVD process suitable for manufacturing which incorporates tantalum and its various nitrides and alloys into ULSI computer device structures.

One such process has been established by the present inventors using tantalum source precursors and reaction temperatures of from 70° to 675° C. and is described in Kaloyeros et al., "Low Temperature Plasma-Promoted Chemical Vapor Deposition Of Tantalum From Tantalum Pentabromide For Copper Metallization," *Journal of Vacuum Science and Technology B* (1998). The precursors are introduced in a vapor state and have the following chemical structure:

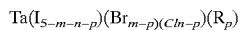
Ta(I$_{5-m-n-p}$)(Br$_{m-p}$)(Cl$_{n-p}$)(R$_p$)

wherein m is an integer from 0 to 5, n is an integer from 0 to 4, p is an integer from 0 to 4, and R is selected from the group consisting of hydrogen and lower alkyl. Because the bonding configuration and associated electronic environment or tantalum pentabromide and tantalum pentaiodide, among other halides within the above formula were quite different from tantalum pentachloride as used in prior attempts to deposit tantalum using CVD, these precursors were evaluated as possible routes to low temperature CVD of tantalum films. Since tantalum pentaiodide and tantalum pentabromide had corresponding dissociation energies which are significantly lower than that of tantalum pentachloride, they demonstrated the ability to deposit tantalum-based films at significantly lower processing temperatures than those necessary for tantalum pentachloride. In addition, due to the activation energy of iodine and bromine, their diffusion was expected to be significantly higher than chlorine, since I and Br are much heavier than Cl. This property has important implications for the effects of residual halide incorporation in titanium- and tantalum-based films, with a certain concentration of iodine or bromine requiring appreciably higher thermal energy to diffuse out of the film lattice than chlorine since the molecules are much larger. This property is supported by investigations of the present inventors with respect to the thermal stability of iodine in titanium nitride films grown by thermal CVD from tetraiodotitanium as described in Kaloyeros et al., "Barrier Properties of TiN Films Grown by Low Temperature CVD From TiI$_4$," *Journal of the Electrochemical Society* (1997). They are also supported by similar studies of the thermal stability of bromine in tantalum nitride films grown by thermal CVD from tantalum pentabromide, as carried out by the present inventors and as described in Kaloyeros et al., "TaN$_x$ Films Grown by Inorganic Low Temperature TCVD: Diffusion Barrier Properties in Cu Metallization," *Journal of the Electrochemical Society* (1999).

While the bromine and iodine-based methods form acceptable films, there is a need in the art for further methods and routes for providing tantalum- and tantalum-based films, preferably which are suitable for ULSI fabrication in manufacturing. A need in the art exists for additional methods for forming tantalum-based films of an electronic grade, i.e., of an especially ultra-high quality, in terms of purity, with impurity concentrations well below 1 at %, which exhibit a non-columnar structure to perform appropriately as a barrier layer, and which are conformal to the complex topography of ULSI circuitry. In particular, a need in the art exists for tantalum source precursors with high vapor pressure, ease in evaporation at low temperature, and high delivery flux to the CVD reaction zone to allow the growth of tantalum and tantalum-based films at the high growth rates required to ensure manufacturing-worthy wafer throughput.

There is further a need in the art for additional methods which can readily prepare single films consisting of either pure tantalum, or tantalum-based films such as tantalum nitrides or bilayer films which include appropriately dimensioned films of tantalum and its various alloys. There is also a need for additional methods which are amenable to processing temperatures below about 675° C., and preferably below about 500° C. to prevent thermally induced damage to the device.

SUMMARY OF THE INVENTION

The invention includes a method for the chemical vapor deposition of a film comprising tantalum onto a substrate. The method comprises introducing into a deposition chamber: (1) a substrate; (2) a source precursor comprising fluorine in the vapor state and having the formula (I):

Ta(F$_{5-q-p}$)(X$_{q-p}$)(R$_p$)  (I)

wherein X is selected from the group consisting of bromine, iodine, chlorine, and combinations thereof; q is an integer from 0 to 4; p is an integer from 0 to 4; and R is selected from the group consisting of hydrogen and lower alkyl and (3) a reactant gas. The temperature of the substrate within the chamber is maintained at from about 70° C. to about 675° C. for a period of time sufficient to deposit a film comprising tantalum on the substrate.

In one embodiment, the method further comprises depositing a second film comprising tantalum on the film deposited on the substrate for forming a multilayered structure while the substrate remains fixed in the chamber. The second film comprising tantalum is selected from the group consisting of a pure tantalum film, a $TaN_x$ film, wherein x is greater than 0 and less than or equal to about 2, a $TaSi_y$ film, wherein y is greater than 0 and less than or equal to about 3, and a $TaN_xSi_y$ film, wherein x is greater than 0 and less than or equal to about 2 and y is greater than 0 and less than or equal to about 3.

In a further embodiment, the method further comprises using a substrate comprising silicon and heating the substrate and deposited film comprising tantalum to a temperature of from about 700° C. to about 950° C. for providing silicon to the deposited film comprising tantalum.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
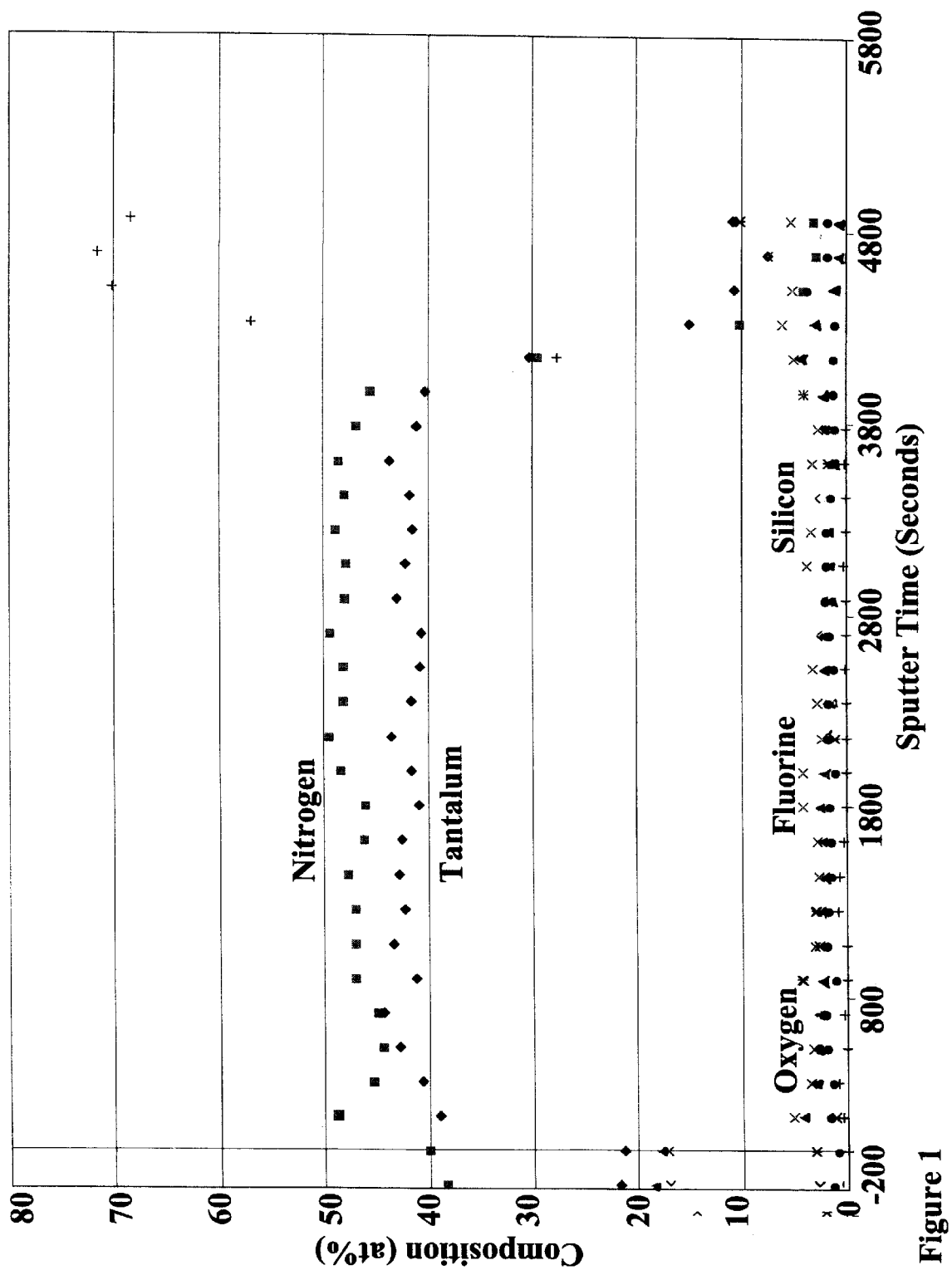
FIG. 1 is a representation of an Auger electron spectrum (AES) of a tantalum nitride film formed in Example 1.

The present invention relates to fluorine-containing chemical source precursors and associated thermal and plasma methods for the chemical vapor deposition on various specialty substrates of conformal tantalum, tantalum nitride alloys including $TaN_x$, wherein x preferably has any value ranging from greater than 0 and less than or equal to about 2, tantalum silicide alloys including $TaSi_y$, wherein y preferably has any value ranging from greater than 0 and less than or equal to about 3, and tantalum silicide nitride alloys including $TaN_xSi_y$, wherein x and y are preferably as defined above. The invention deposits such films as a metallization layer in the form of a single tantalum-based film on a substrate, or as several such films layered on a substrate forming a multilayered structure.

Such films are useful on substrates such as semiconductor substrates, for example, silicon, germanium and gallium arsenide substrates, having sub-micron features and structures. The single or multilayered films can be deposited ex situ in different reactors, or in situ in a single reactor, or a combination thereof. For example, several layers can be deposited in a single reactor and a subsequent layer can be deposited in a separate reactor. When more than one reactor is used, the reactors are preferably interconnected through leak-tight transfer arms and load locks which allow sample transfer between the different reactors without exposing the coated substrate to air.

In microelectronic applications, a preferred substrate is intended to become an integrated circuit, and has a complex topography formed of holes, trenches, vias, and the like, to provide the necessary connections between materials of various electrical conductivities that form a semiconductor device. The substrate is preferably formed of, for example, silicon, silicon dioxide, silicon nitride, or doped versions and mixtures thereof.

The substrates of the invention are more preferably intended for ULSI circuitry, and are patterned with holes, trenches, and other features with diameters of less than 1.0 micron, often less than 0.50 micron, and even 0.25 micron or less. Substrates having such small features are known herein as "sub-quarter-micron" substrates. Sub-quarter-micron substrates which may be coated according to the invention also typically have features with high aspect ratios, from about 3:1 to about 6:1 and beyond, where the aspect ratio is defined as the ratio of a feature's depth to its diameter, as viewed in cross section. As used herein, sub-quarter-micron substrates have feature diameters less than about 0.25 micron, and the aspect ratio of the features is typically larger than about 3:1. Features having an aspect ratio of about 4:1 and beyond are found on most substrates for ULSI circuitry.

Examples of substrates which may be coated include semiconductor substrates as mentioned above, or metal, glass, plastic, or other polymers, for applications including, for example, hard protective coatings for aircraft components and engines, automotive parts and engines and cutting tools; cosmetic coatings for jewelry; and barrier layers and adhesion promoters for flat panel displays and solar cell devices. Preferred metal substrates include aluminum, beryllium, cadmium, cerium, chromium, cobalt, copper, gallium, gold, lead, manganese, molybdenum, nickel, palladium, platinum, rhenium, rhodium, silver, steel, including stainless steel, iron, strontium, tin, titanium, tungsten, zinc, zirconium, alloys thereof and compounds thereof, such as silicides, carbides and the like.

There is really no limitation on the type of substrate which can be used in the present method. However, the substrate is preferably stable at the conditions used for depositing the film or films onto the substrate. That is, the substrate is preferably stable to temperatures of from about 70° C. to about 950° C., and preferably from about 70° C. to about 700° C., depending on the type of film to be deposited and the intended use of the coated substrate.

According to the CVD processes used in the method of the present invention, conformal single, bilayer or other multilayer films may be placed on subquarter-micron substrates. Conformal coatings of tantalum, tantalum nitride, tantalum silicide and tantalum nitride silicide, may be placed on sub-quarter-micron substrates having feature diameters of about 0.25 micron, or smaller, and with aspect ratios as much as about 6:1, and larger.

As used herein, "conformal coating" refers to a coating that evenly covers a substrate having a complex topography.

The evenness of the coating can be measured by, for example, examining the thickness of the coating along the walls and bottom of a hole in the substrate, and determining the variation in the thickness of that coating. According to the invention, sub-quarter-micron substrates are conformally coated, when the coating has a thickness, measured at any point normal to the surface of a wall or floor of a hole in the surface of the substrate, which is within 25% of the thickness at any other point in the hole. According to a preferred embodiment, the variation in coating thickness is within 10%, i.e., at no point is the thickness of the coating either 10% greater or 10% smaller than the average thickness of the coating.

As used herein, particularly when referring to ULSI devices and coated substrates useful therein, "step coverage" refers to the ratio of the coating thickness at the bottom of a feature such as a trench or via, to the thickness of the coating on the top surface of the substrate adjacent to the feature, where the ratio is multiplied by 100 to provide a percent value. The process of the invention provides conformally coated sub-quarter-micron substrates having step coverage of greater than about 70% in sub-quarter-micron structures.

The invention uses fluorine-containing complexes for the low temperature growth of either tantalum and its nitrides and/or its silicide alloys, depending on the reactants employed. In situ, sequential CVD processes using a single halide precursor can be used to smoothly and reversibly change between tantalum and its nitrides and/or silicide alloys by appropriately modifying the processing conditions. It also provides CVD processes which exploit fluorine-containing source precursors to sequentially deposit each of a wide variety of pure tantalum or tantalum-based layers necessary for a particular application.

The fluorine-based halide sources of the present invention are excellent candidate precursors to meet target specifications for tantalum source precursors which have high vapor pressure, ease in evaporation at low temperature, and high delivery flux to the CVD reaction zone to allow the growth of tantalum and tantalum-based films at high growth rates to provide manufacturing-worthy wafer throughput. In addition, the use of fluorine-based halide sources is desirable given that the chemical characteristics of fluorine permit the complete and total dissociation of tantalum-fluorine bonds in the corresponding source precursor through a highly efficient reduction process by hydrogen- or nitrogen-based reactants. The net result is the formation of electronic-grade tantalum and tantalum-based films with practically no fluoride contamination.

The invention includes a method for the CVD of a film which comprises tantalum, i.e., a pure tantalum or tantalum-based film, onto a substrate. The method includes introducing into a deposition chamber a substrate, a fluorine-containing source precursor and a reactant gas which may further include a carrier gas to facilitate transport of the precursor to the reaction area in certain circumstances, for example, when a bubbler-type delivery system is used. The reactant gas may be a single gas, or a mixture of gases. The reactant gas serves to reduce the fluorine-containing precursor to produce the tantalum- or tantalum-based film.

Fluorine-containing source precursors in the vapor state are used in the invention. Such precursors preferably have the formula (I):

$$Ta(F_{5-q-p})(X_{q-p})(R_p) \quad (I)$$

wherein X may be bromine, iodine, chlorine or combinations thereof; q is an integer from 0 to 4; and p is from 0 to 4 and R may be hydrogen or lower alkyl, for example, and preferably methyl or neopentyl.

According to one preferred embodiment, the source precursor of formula (I) is $TaF_5$ or $(CH_3)_3TaF_2$, and the substrate is a silicon or silicon dioxide wafer useful in the manufacture of an ULSI device. In view of the high stability of fluorine bonds in comparison with chlorine and other halogens, it is expected that the thermal decomposition of fluorine-based precursors would require even more energy to dissociate the tantalum-fluorine bonds for forming films than in the case of chlorine. Further, due to the smaller size of the fluorine atoms in comparison with chlorine atoms, it would be expected that even more difficulties would be encountered with respect to diffusion of residual fluorine from the tantalum-based layer into other films and/or the substrate, causing corrosion and reliability problems.

However, without wishing to be bound by theory, the applicants believe that, quite unexpectedly, the electronegativity and associated chemical characteristics of fluorine allow the complete and absolute dissociation of tantalum-fluorine bonds in the corresponding source precursors through a highly effective reduction process in the presence of hydrogen- or nitrogen-based reactants or in the presence of those reactants in combination with helium. This reduction process is believed to be driven by the favorable mechanisms and affinity for electronic interactions between fluorine in the source precursor and hydrogen and/or nitrogen species in the gaseous reactants. These mechanisms result in the efficient dissociation of the fluorinated source precursor at significantly lower temperatures, due to reduction by hydrogen and/or nitrogen reactant gas, alone or used with helium, than would be expected in the case of a thermally-driven dissociation in the absence of such reactants. The efficiency of the reduction process is also believed to allow for applicants' formation of electronic-grade tantalum and tantalum-based films with practically no fluorine contamination, due to the efficacy and strength of the mechanisms of electronic interactions between hydrogen and/or nitrogen and fluorine in the precursor. The strength of these interactions leads to the total elimination of fluorine species from the reaction zone through the formation of byproducts such as hydrogen fluoride and nitrogen fluoride species, thus preventing the incorporation of fluorine in the resulting tantalum-based films. The net outcome is the formation of such films with extremely low residual fluorine concentrations, if any. These concentrations are well below the values that could cause corrosion and reliability problems if fluorine out-diffusion were to occur from the tantalum and tantalum-based films.

The reactant gas is preferably hydrogen or a gas comprising nitrogen such as nitrogen, ammonia and/or hydrazine. However, helium may also be provided to the reactant gas(es), preferably in plasma form to provide energy to the reaction. The hydrogen and/or gas comprising nitrogen (such as those noted above) act to ensure reduction of the fluorinated source precursors, leading to low temperature deposition of tantalum and tantalum-based films. If a carrier gas is used to facilitate transport of the source precursor for certain systems, the carrier gas may be hydrogen, helium, oxygen, fluorine, neon, chlorine, argon, krypton, xenon, carbon monoxide, carbon dioxide, nitrogen, ammonia, hydrazine, nitrous oxide, and/or water vapor. In addition to performing transport functions, some carrier gases, such as fluorine, may also serve to stabilize sub-pentafluoride complexes that might be present in the delivery stream to the reaction zone.

The reactant and/or carrier gas can be varied depending upon the type of film to be formed. For example, for forming pure tantalum film, the reactant gas is preferably hydrogen or hydrogen in combination with helium, such as helium plasma. Suitable carrier gas(es) include hydrogen, helium, oxygen, fluorine, neon, chlorine, argon, krypton, xenon, carbon monoxide, carbon dioxide, and water vapor. Most preferably, for forming pure tantalum films, the reactant or reactant and carrier gas combination is hydrogen alone; hydrogen and helium along with a xenon and/or argon carrier gas; or hydrogen alone in combination with argon or xenon.

The fluorine-containing source precursor, the reactant gas(es), carrier gas(es) used, if any, and the substrate are maintained in the chamber at an interior reaction temperature of from about 70° C. to about 675° C., preferably at least 100 C. Most preferably, a plasma having a plasma power density of from about 0.01 to about 10 W/cm$^2$ is provided to the chamber. The plasma preferably has a frequency of from about 0 Hz to about $10^8$ Hz. The components are maintained under these conditions for a period of time sufficient to deposit a pure tantalum or tantalum-based film onto the substrate. The deposition step typically takes from about 30 seconds to about 30 minutes depending upon the type of tantalum-based film to be deposited, the processing conditions and the desired film thickness.

According to a further embodiment of the method, a tantalum nitride alloy film is deposited by CVD on a substrate. Tantalum nitride alloys, such as TaN$_x$, wherein x can be any value greater than 0 and less than or equal to about 2, are deposited by introducing into the deposition chamber the substrate, the fluorine-containing source precursor of formula (I) above, and a reactant gas as noted above which includes a gas comprising nitrogen, such as, for example, nitrogen, ammonia and/or hydrazine. The nitrogen-containing gas within the reactant gas is preferably selected from the group consisting of ammonia, nitrogen, and hydrazine. If a carrier gas is used, it may be any of those mentioned above, preferably, the at least one carrier gas and the nitrogen-containing reactant gas are used in a combination of hydrogen, nitrogen, ammonia, and/or hydrazine along with a carrier gas which may be one or more of the following: argon, hydrogen, nitrogen, ammonia and/or hydrazine. These components are maintained in the deposition chamber at a temperature of from about 70° C. to about 675° C., and preferably at least 100° C. Most preferably, for forming tantalum nitride alloy films, the temperature in the chamber is from about 250° C. to about 500° C. The substrate is maintained in the chamber for a time sufficient to deposit the tantalum nitride alloy film. It is preferred that for forming tantalum nitride alloy films, the compound of formula (I) is TaF$_5$ or (CH$_3$)$_3$TaF$_2$, with the substrate being a silicon or silicon dioxide wafer useful in the manufacture of a ULSI device.

The tantalum nitride alloys are most preferably deposited using as the reactant gas, one or more of the following: hydrogen and/or helium in combination with nitrogen and using a carrier gas that may be either ammonia, argon, xenon, and/or hydrazine; nitrogen alone or with helium and using a carrier gas that may be ammonia, argon, and/or xenon; or ammonia alone or with helium and using a carrier gas that may be argon and/or xenon.

Preferably the components are maintained in the chamber in the presence of a plasma having a plasma power density of from about 0 to 10 W/cm$^2$, more preferably from about 0.01 to about 10 W/cm$^2$ for a period of time sufficient to deposit the tantalum-based film, i.e., the tantalum nitride alloy film on the substrate. According to this embodiment, the source precursor is most preferably TaF$_5$, in combination with a reactant gas(es) including a nitrogen-containing reactant as such as nitrogen, ammonia and/or hydrazine, and a carrier gas(es), if any, being deposited on a silicon or silicon dioxide wafer substrate for use in the manufacture of a ULSI device.

Alternating or sequentially deposited multilayers of pure tantalum and/or tantalum nitride alloy films may be provided to the substrate preferably while the substrate is kept in a single deposition reactor. The substrate and source precursor are provided to the deposition chamber, the source precursor being in the vapor state. The preferred gas is then provided for forming alternating or sequential film layers at the preferred deposition chamber temperatures as noted above. Either the tantalum metal film or tantalum nitride alloy film can be deposited first onto the substrate and the layers can be alternated or applied in any given order or sequence.

Alternatively, such alternating or sequential multiple layers of pure tantalum or tantalum nitride alloy can be deposited on a substrate while the substrate is moved within the single deposition reactor. Further, the multiple layers can be provided to the substrate while the substrate is moved between two or more separate reactors, each used for deposition of one or more of the tantalum or tantalum nitride alloy layers depending upon the particular application of the coated substrate. Either the pure tantalum film or tantalum nitride film can be deposited first onto the substrate. The substrate is moved from one reactor, where one or more such layer is deposited, to another reactor(s), where additional layer(s) are deposited. Preferably, the reactors are interconnected through leak-tight transfer arms and/or load locks which allow sample transfer between the different reactors without exposing the coated substrate to air.

According to a further, preferred embodiment, a pure tantalum film or tantalum nitride alloy film is deposited onto the substrate to provide a coated substrate, and then a series of tantalum-based films, such as pure tantalum or tantalum nitride are deposited onto the coated substrate, preferably with increasing nitrogen concentration in subsequent layers. The tantalum film and the tantalum nitride alloy films are formed as described above.

The present invention uses CVD methods to prepare pure (electronic grade) tantalum and tantalum nitride alloy films, for example, for use as diffusion barriers or as adhesion interlayers in integrated circuit fabrication, and in particular in ULSI fabrication. The method of the present invention directs the carefully selected fluorine-containing precursors to either a thermal or plasma-promoted CVD reactor, under preferred reaction conditions, to achieve the high quality tantalum-based films.

In addition to the tantalum nitride alloy films described above, tantalum silicide nitride alloy films and tantalum silicide alloy films may also be prepared according to the present method as discussed in more detail below. Such films can also be formed in multilayered laminated structures, for example, bilayer films of tantalum and tantalum nitride, bilayer films of tantalum and tantalum silicide nitride, and multilayered films of tantalum and tantalum-nitride films in either alternating or sequential configurations.

To prepare the tantalum and tantalum-based films according to the present invention, thermal CVD or plasma-promoted CVD may be used. "Thermal CVD" refers to a CVD process wherein all reactants are introduced into the CVD reactor in gaseous form, and the energy necessary for bond cleavage is supplied entirely by thermal energy. "Plasma-promoted CVD" refers to a CVD process wherein all reactants are introduced into the CVD reactor in gaseous form, and the energy necessary for bond cleavage is supplied in part by the high energy electrons formed in a glow discharge or plasma having a plasma power density of from about 0 to about 100 W/cm$^2$, preferably from about 0.01 to about 10 W/cm$^2$, and more preferably below 0.5 W/cm$^2$. Plasma-promoted CVD takes advantage of the high energy electrons present in glow discharges to assist in the dissociation of gaseous molecules, as is the case of plasma-enhanced CVD where plasma-enhanced CVD is a generally well-known technique in the art. However, in contrast to plasma-enhanced CVD, which uses high plasma power densities, the low power densities employed in plasma-promoted CVD do not cause premature decomposition of the fluorine-containing source precursors in the gas phase, thus preventing undesirable film contamination. Additionally, the use of a low power plasma density prevents electrical damage to the film and substrate.

Any CVD reactor having the following basic components may be used with the method of the present invention: a precursor delivery system which is used to store and control the delivery of the source precursor, a vacuum chamber, a pumping system to maintain an appropriately reduced pressure, a power supply to create the plasma discharge for plasma-promoted CVD, a temperature control system, and gas or vapor handling capability to meter and control the flow of reactants and products resulting from the process. The precursor delivery system may be any of the following: a pressure-based bubbler or sublimator, a hot-source mass flow controller, a liquid delivery system, direct liquid injection system or similar apparatus.

In depositing tantalum-based films according to the present invention, the source precursor is preferably placed in a reservoir which could be heated by a combination of resistance heating tape and associated power supply to a temperature which is high enough to ensure the precursor's sublimation or vaporization, but not so high as to cause premature decomposition of the precursor. A mass flow controller, which may be isolated from the reservoir by a high vacuum valve, is preferably provided to help control gas flow into the reservoir. Gas, for example, hydrogen, helium, argon, xenon and nitrogen, may function as a carrier agent when a conventional pressure- and/or temperature-based mass flow control delivery system is used as a delivery system for precursor into the CVD reactor chamber. Alternatively, such gases may function as pressurizing agents when using a liquid delivery system for the delivery of the precursor to the CVD reactor. Such a system may include a combination micropump and vaporizer head. A suitable example of such a system is the MKS Direct Liquid Injection system. A further example of a suitable delivery system for the source precursor is a hot source mass flow controller, for example, an MKS Model 1150 MFC, which does not require the use of a carrier or pressurizing gas. A further example is a solid source delivery system, for example, the MKS 1153 system, which does not require the use of a carrier or pressurizing gas.

In a preferred embodiment, the precursor vapor (or precursor and carrier gas depending upon the delivery system being used) is preferably transported into the CVD reactor through delivery lines which are maintained at the same temperature as the reservoir, using a combination of resistance heating tape and an associated power supply, to prevent precursor recondensation. The CVD reactor may be an eight-inch wafer, cold-wall, stainless steel CVD reactor preferably equipped with plasma generation capability. The plasma may be generated by various sources, such as direct current plasma, radio frequency plasma, low frequency plasma, high density plasma, electron cyclotron plasma, inductively coupled plasma, microwave plasma or other similar sources. The plasma may be used for dual purposes. It may be used for in pre-deposition substrate cleaning, and for actual deposition if using plasma-promoted CVD.

The reactor is preferably also equipped with an electrical bias on the substrate. The bias can be derived from direct current, a low radio frequency of less than 500 kHz, a high radio frequency of from 500 kHz to about 10$^6$ kHz, or a microwave frequency of from about 10$^6$ kHz to about 10$^8$ kHz and similar sources.

Evacuation of the CVD deposition reactor is possible using various pumping systems. Two such systems are preferred. One system is a high vacuum (10$^{-6}$ torr or more) pumping system, which may use either a cryogenic- or turbomolecular-type pump. This system ensures a high vacuum base pressure in the reactor. A vacuum system having a roots blower or dry pump may also be used for handling the high gas throughput during CVD runs. Both pumping units are preferably isolated from the CVD reactor by high vacuum gate valves.

The CVD reactor is preferably equipped with a high vacuum load-lock system which is used for transporting and loading substrates as large as about 300 mm wafers into the reactor. Alternatively, the reactor may interface with a vacuum central handler unit which may be used to transfer the substrate between multiple CVD reactors to deposit sequential or alternating layers of tantalum and/or tantalum-based films.

After being charged to the reservoir, the fluorine-containing source precursor is heated to a temperature which is high enough to ensure the precursor's sublimation or vaporization, but not so high as to cause its premature decomposition. Preferably, the source precursor is heated to a temperature of from about 35° C. to about 200° C. When conventional pressure- and/or temperature-based mass flow control type or a solid-source-type delivery systems are used to control the flow of precursor into the CVD reactor, the precursor in the reservoir is heated. Alternatively, when a liquid delivery system is used, for example, the MKS Direct Liquid Injection system consisting of a combination micropump and vaporizer head, the liquid in the reservoir is room temperature. In such a liquid delivery system, the vaporizer head, not the liquid in the reservoir, is heated to a temperature which is high enough to ensure the precursor's sublimation or vaporization, but not so high as to cause its premature decomposition.

When a gas is used, any gaseous substance may be used which is substantially not reactive with the fluorine-containing source precursor or which reacts with the precursor to form an intermediate product which is more easily transported to the reaction zone and/or could more readily decompose to yield the desired tantalum or tantalum-based film. Exemplary carrier gases are listed above. Hydrogen is particularly preferred as a carrier gas for both thermal CVD and plasma-promoted CVD. The flow rate of carrier gas may vary from about 10 standard cm$^3$/min to about 5 standard l/min, and preferably from about 10 to about 100 cm$^3$/min, for both thermal CVD and plasma-promoted CVD.

In all modes of delivery described above, the flow rate of the vapor of the source precursor could range from about 0.01 to about 2000 standard cm$^3$/min. Preferably the flow rate of source precursor vapor into the CVD chamber is from about 0.1 to about 100 standard cm$^3$/min.

The reactant gas which may also function as a carrier gas, is preferably hydrogen for both thermal CVD and plasma-promoted CVD of pure tantalum films. Ammonia or hydrazine, singly or mixed with hydrogen, are particularly preferred nitrogen-containing reactant gases, which may also function as carrier gases, for both thermal CVD and plasma-promoted CVD of tantalum nitride and other tantalum-based films. The flow of the reactant gas and/or the carrier gas, which may be a single gas or mixtures of gases, is preferably from about 10 standard $cm^3$/min to about 10 standard 1/min, and more preferably from about 100 standard $cm^3$/min to about 5 standard 1/min. The corresponding reactor pressure is preferably 10 mtorr for low pressure to 1000 torr for atmospheric pressure CVD, and more preferably from about 100 mtorr to 15 torr.

Although for convenience purposes, the gas(es) discussed herein are referred to as "reactant" gas(es) or "carrier" gas(es), the function of these gases should not be misconstrued. In fact, in addition while the reactant gas undergoes reaction in the chamber during deposition, it may also function to carry the vapor of the source precursor into the reaction chamber. Also, a "reactant" gas as introduced may include inert components, in which case some or all of the reactant gas may serve merely to dilute the reactive atmosphere inside the deposition chamber.

According to a preferred embodiment of plasma-promoted CVD for forming a tantalum film, hydrogen alone or with helium plasma is the reactant gas and there is no "carrier" gas, because the hydrogen alone or with helium plasma acts as the catalyzing agent to decompose the precursor on the substrate. According to another preferred embodiment of plasma-promoted CVD for forming a tantalum film, hydrogen is introduced into the deposition chamber simultaneously as the reactant and carrier gas. According to another preferred embodiment for forming tantalum film, hydrogen is introduced into the deposition chamber as a reactant gas simultaneously with an inert gas such as neon, argon, krypton, and/or xenon as the carrier gases.

Pure tantalum film may also be prepared using thermal CVD according to the invention. To prepare a pure tantalum film by thermal CVD, for example, hydrogen, argon, and/or xenon may be introduced as the reactant and carrier gases with hydrogen functioning as the reactant in the deposition chamber. According to a preferred embodiment, argon functions as a carrier and hydrogen functions as a reactant gas.

Plasma-promoted CVD according to the present invention may also be used to prepare tantalum-based films, such as tantalum nitride alloys. In one preferred embodiment for the preparation of tantalum nitride films, in the form of TaN, by plasma-promoted CVD, the reactant gas includes a nitrogen-containing reactant gas to be introduced into the chamber. Nitrogen, ammonia and hydrazine are preferred nitrogen-containing reactant gases according to the invention. When nitrogen is the nitrogen-containing reactant gas, it may function alone as the reactant gas and also as a carrier gas, or hydrogen or an inert gas such as argon or xenon may also be introduced simultaneously with nitrogen, in which case, hydrogen and nitrogen may function as reactants, as well as carrier gases, and argon and/or xenon may function as additional carrier gases. Hydrogen, nitrogen and/or an inert gas may also be co-introduced as a combined reactant gas, i.e., e.g., hydrogen and/or an inert gas may be in admixture with the ammonia or hydrazine gas. Nitrogen in combination with at least one of ammonia and hydrazine may be the sole gases present in the deposition chamber during the preparation of tantalum-nitride films, in which case nitrogen with any of these three gases would function collectively as the reactant gas including a nitrogen-containing gas. According to one preferred embodiment to prepare TaN film by plasma-promoted CVD, hydrogen, alone or with helium, and nitrogen are introduced into the reaction chamber simultaneously with the fluorine-containing source precursor.

Tantalum-based films may also be prepared using thermal CVD according to the invention. To prepare a tantalum-based film such as tantalum nitride film by thermal CVD, for example, ammonia, nitrogen, and/or hydrazine may be introduced as a reactant gas including a nitrogen-containing reactant gas into the deposition chamber. If a carrier gas is used, preferably, the carrier gas includes gases such as hydrogen, nitrogen, or an inert gas such as argon or xenon. According to one preferred embodiment, hydrogen functions as a carrier/reactant and ammonia as a nitrogen-containing reactant gas.

When ammonia or hydrazine is the nitrogen-containing gas within the reactant gas during plasma-promoted CVD of tantalum nitride films, then it is preferably introduced into the deposition chamber as a reactant gas, and hydrogen and/or an inert gas such as argon or xenon preferably function as carrier gas(es). Hydrogen and/or an inert gas may also be co-introduced as an admixed reactant gas, with, for example, ammonia and/or hydrazine gas.

Regardless of whether thermal CVD or plasma-promoted CVD is used to prepare the tantalum nitride film, and regardless of the exact identities of the reactant gas and nitrogen-containing gas or any carrier gas(es) used, it is important to maintain at least one mole of nitrogen atoms in the reaction chamber for each mole of tantalum in the reaction chamber if stoichiometric TaN is desired. If less than a stoichiometric amount of nitrogen is present in the deposition chamber, then tantalum metal or a tantalum-rich film, such as $Ta_2N$, or $TaN_a$, where a<1, will be deposited. This could allow the formation of a mixed phase film, i.e., a film having phases of pure tantalum and tantalum-rich nitrides. While a mixed phase film is preferred for some applications, and methodology to prepare such tantalum-based films and substrates having these films coated thereon is within the scope of the invention, if pure TaN film is to be deposited for a specific use, i.e., a film having a Ta:N molar ratio of 1:1. then an adequate supply of nitrogen atoms must be provided to the deposition chamber.

Additionally, regardless of whether thermal CVD or plasma-promoted CVD is used to prepare the tantalum-nitride film, and regardless of the exact identities of the reactant gas, nitrogen-containing gas and any carrier gas(es) used, it is important to maintain an excess of nitrogen atoms, i.e., more than one mole of nitrogen atoms in the reaction chamber for each mole of tantalum in the reaction chamber, if a nitrogenrich Ta-based film is desired. If excess nitrogen is present in the deposition chamber, then a nitrogen rich film, such as $TaN_z$, where z>1, will be deposited. This also could allow the formation of a mixed phase film, i.e., a film having phases of pure tantalum, tantalum-rich nitride, and nitrogen-rich nitride.

In one embodiment of the method, preferably using either thermal CVD or plasma-promoted CVD, when forming a pure tantalum or tantalum nitride alloy film, using any of the above-mentioned reactant gas(es) and optional carrier gas (es), a silicon-containing compound, preferably in the vapor state, is provided to the reaction chamber. The additional silicon provides a tantalum silicide phase, preferably $TaSi_y$, wherein y may be any value greater than 0 and up to and including 3, or a tantalum nitride silicide phase, preferably $TaN_xSi_y$, wherein x is greater than 0 and less than or equal to about 2 and y is greater than 0 and less than or equal to about 3.

The silicon-containing compound is preferably a halide-based compound of formula (II):

$$Si(F_{4-r-s})(X_{r-s})(R_s) \qquad (II)$$

wherein r is an integer from 0 to 3, s is an integer from 0 to 3, X may be chlorine, bromine, iodine or combinations thereof, and R is defined in the same manner as for formula (I) above. In addition to the use of silicon-containing compounds of the invention of formula (II), when forming tantalum silicide films or when forming tantalum nitride silicide phase films according to the present invention, further silicon-containing compounds such as the compound of formula (III) may be used along with or as an alternative to the compounds of formula (II). Such compounds are as follows:

$$Si(I_{4-t-v-w})(Br_{t-w})(Cl_{v-w})(R_w) \qquad (III)$$

wherein t is an integer from 0 to 4, v is an integer from 0 to 4, w is an integer from 0 to 4, and R is defined in the same manner as for formulas (I) and (II) above.

The plasma used in plasma-promoted CVD may be generated by any of the plasma sources described above. The plasma frequency may range from 0 Hz to about $10^8$ kHz or more, and preferably from about 1 MHZ to about $10^6$ kHz. Plasma power densities preferably range from about 0.01 to 10 W/cm$^2$, and more preferably from 0.01 to 0.5 W/cm$^2$.

An electrical bias such as those described above, may also be applied to the substrate. The corresponding power density preferably ranges from greater than about 0 W/cm$^2$ to $10^3$ W/cm$^2$, and more preferably 0.001 W/cm$^2$ to 10 W/cm$^2$.

An alternative method of providing silicon to a tantalum or tantalum nitride alloy film deposited according to the present invention is by using a siliconbased or polysilicon-based substrate. After the tantalum or tantalum-nitride film is formed, the temperature of the substrate in the reactor is typically raised to a temperature high enough to cause the silicon to react with the tantalum or tantalum nitride phase in the film, preferably from about 700° C. to about 950° C. such that the silicon from the substrate reacts with the tantalum in the film formed on the substrate to provide a tantalum silicide or tantalum nitride silicide phase. The type and amount of silicide phase provided to the film depends on the type of reactant gas(es) and/or carrier gas(es) used and the processing temperature, as discussed above. In these cases, the silicide phase may be provided without the use of a silicon-containing compound in the vapor state such as the halide-based compound of the general formulas (II) and/or (III).

The tantalum and tantalum-based films formed in accordance with the present invention may advantageously be tailored to columnar or non-columnar structures. The tantalum and tantalum-based films of the invention also have excellent ohmic contact properties when formulated into ULSI circuitry. Also, the tantalum and tantalum-based films have excellent adhesion properties and act as good barriers to metal diffusion when formulated into ULSI circuitry.

The inventive tantalum-based films, whether prepared by thermal or plasma-promoted CVD, typically have a nitrogen to tantalum ratio of about 0 to 2 and a silicon to tantalum ratio of from about 0 to 3.

While the invention allows the separate and independent production of pure tantalum and tantalum-based films, the inventive method also provides for in situ sequential CVD processes in which the deposition mode of a single tantalum precursor is smoothly and reversibly switched between forming a pure tantalum film and tantalum-nitride film, by changing the reactant gases which can also function as carrier gases.

Thus, according to one preferred embodiment of the inventive method, the deposition reactor may be charged with a vapor from a compound of formula (I), in the presence of hydrogen and a plasma having a plasma power density of about 0.01 W/cm$^2$ to about 0.5 W/cm$^2$. As described previously, these reaction conditions result in the formation of a pure tantalum film on a substrate. The plasma may then be turned off, and the reactant gas changed from hydrogen to a nitrogen-containing reactant gas such as ammonia. Under these revised reaction conditions, a film of TaN$_x$, wherein x is as defined above, is deposited on top of the previously deposited pure tantalum film, thereby providing a bilayer film on a substrate.

According to another preferred embodiment of the inventive method, the deposition reactor is charged with a vapor from a compound of formula (I), in the presence of hydrogen and a plasma having a plasma power density of about 0.01 W/cm$^2$ to about 0.5 W/cm$^2$ to form a pure tantalum film on a substrate. The plasma may then be turned off, and a nitrogen-containing reactant gas, such as ammonia introduced along with a vapor of a different source precursor according to formula (I). Under these revised reaction conditions, a film of TaN$_x$ is deposited on top of the initially deposited pure tantalum film, to provide a bilayer film of the invention.

In situ, sequential CVD can also be used with a single source precursor and a single silicon-containing compound in vapor form to smoothly and reversibly switch between a pure tantalum film, a TaSi$_y$, and a TaN$_x$Si$_y$, by changing reactant gases. Thus, according to one preferred embodiment of the method, the deposition reactor is charged with a vapor from a source precursor according to formula (I), in the presence of hydrogen and a plasma having a plasma power density of about 0.01 W/cm$^2$ to about 0.5 W/cm$^2$ to form a pure tantalum film on the substrate. The plasma is then turned off, and the reactant gas changed from hydrogen to a nitrogen-containing reactant gas such as ammonia. A vapor of a silicon-containing compound such as a compound according to either of formulas (II) and/or (III) is also introduced into the deposition reactor along with the nitrogen-containing reactant gas. Under these revised reaction conditions, a film of TaN$_x$Si$_y$, wherein x and y are independently greater than 0 and less than or equal to about 2, is deposited on top of the initially deposited pure tantalum film, to provide a bilayer film on the substrate.

According to another preferred embodiment of the inventive method, the deposition reactor is charged with a vapor of a source precursor according to formula (I), in the presence of hydrogen and a plasma having a plasma power density of about 0.01 W/cm$^2$ to about 0.5 W/cm$^2$ to form a pure tantalum film on the substrate. The plasma is then turned off, and the reactant gas is changed from hydrogen to a nitrogen-containing reactant gas such as ammonia. A vapor of a different source precursor according to formula (I) may also be introduced into the deposition reactor instead of the first source precursor, along with vapor of a silicon-containing compound such as a compound according to formulas (II) and/or (III).

Under these revised reaction conditions, a film of TaN$_x$Si$_y$, wherein x and y are as defined above, is deposited on top of the initial pure tantalum film, to provide a bilayer film.

It should be understood, based on this disclosure, that any of the above described embodiments could be reversed or otherwise modified with respect to sequence, e.g., either of the tantalum nitride, tantalum silicide or tantalum nitride silicide films could be initially deposited on the substrate, followed by the deposition of a tantalum or other tantalum-based film. Preferably, the pure tantalum film is initially deposited in contact with the substrate, which is preferably a silicon or silicon-containing substrate. It should be also understood, based on this disclosure, that more than two compositionally diverse layers may be deposited on a substrate, without the need to remove the substrate from the reaction zone.

It should also be understood, based on the disclosure, that any suitable CVD technology for preparing a tantalum or tantalum-based film, alone or in combination, may be used in accordance with the method of the present invention. For example, thermal CVD using a hydrogen reactant gas may be used to deposit a pure tantalum film, followed by use of plasma-promoted CVD using hydrogen and nitrogen as the reactant gas including a nitrogen-containing gas to deposit a tantalum nitride film for producing a bilayer film on a substrate.

The in situ deposition of tantalum and tantalum-based bilayers and multilayers as described is very convenient for the preparation of ULSI devices. The inventive method allows for formation of a bilayer or multilayer without the necessity of transferring the partially coated substrate between reaction chambers risking exposure to air. That the bilayer or multilayer can be made in a single reaction chamber greatly minimizes the risk of contamination of the film, which may occur during transfer of the partially coated substrate between reaction chambers. Contamination is particularly a problem for tantalum and tantalum-based films, because tantalum is typically reactive with oxygen, and a slight amount of such contamination could destroy the usefulness of the tantalum or tantalum-based coatings in ULSI devices.

The method of the present invention uses selected fluorine-containing tantalum compounds as source precursors which can be converted by use of thermal or plasma-promoted CVD into high-quality tantalum and tantalum-based films. Similarly, the invention provides electronic grade tantalum-nitride films by reacting the same fluorine-containing tantalum compound source precursors with nitrogen-containing reactant gases, and electronic grade tantalum silicides and/or tantalum silicide nitrides by reacting the same precursors with a reactant gas, a vapor of a silicon-containing compound and/or a reactant gas including a nitrogen-containing gas which may be the same or different from the reactant gas. Exemplary chemical reaction formulas pertaining to the method of the present invention are summarized below, wherein $TaF_5$, $SiF_4$ and $SiI_4$ are included as exemplary tantalum source precursors and silicon-containing compounds.

Plasma-promoted or thermal CVD:

$$TaF_5 + H_2 \rightarrow Ta + HF \tag{III}$$

(major byproduct)
Plasma-promoted CVD:

$$TaF_5 + H_2 + N_2 \rightarrow TaN_x + HF \tag{IV}$$

(major byproduct)
Thermal CVD:

$$TaF5 + NH_3 + H_2 \rightarrow TaN_x + HF + NH_4F \text{ (major by products)} \tag{V}$$

(major byproducts)

Plasma-promoted or thermal CVD:

$$TaF_5 + SiI_4 + H_2 \rightarrow TaSi_y + HF + HI \tag{VI}$$

(major by products)
Plasma-promoted CVD:

$$TaF_5 + SiI_4 + H_2 + N_2 \rightarrow TaN_xSi_y + HF + HI \tag{VII}$$

(major by products)
Thermal CVD:

$$TaF_5 + SiI_4 + H_2 \rightarrow TaSi_y + HF + HI \tag{VIII}$$

(major by products)
Thermal CVD:

$$TaF_5 + SiI_4 + NH_3 + H_2 \rightarrow TaN_x + HF + NH_4F \tag{IX}$$

(major byproducts)
Plasma-promoted or thermal CVD:

$$TaF_5 + SiF_4 + H_2 \rightarrow TaSi_y + HF \tag{X}$$

(major byproduct)
Plasma-promoted CVD:

$$TaF_5 + SiF_4 + H_2 + N_2 \rightarrow TaN_xSi_y + HF \tag{XI}$$

(major byproduct)
Thermal CVD:

$$TaF_5 + SiF_4 + H_2 \rightarrow TaSi_y + HF \tag{XII}$$

(major byproduct)
Thermal CVD:

$$TaF_5 + SiF_4 + NH_3 + H_2 \rightarrow TaN_x + HF + NH_4F \tag{XII}$$

(major byproducts)

The invention, as well as the appearance and composition of tantalum-based films deposited according to the method of the present invention, and their structural and electrical properties, will now be described in accordance with the following non-limiting example:

EXAMPLE 1

Pure tantalum nitride films were prepared according to a plasma-promoted CVD method in a standard CVD deposition reactor chamber. The source precursor was tantalum pentafluoride ($TaF_5$) with sublimation temperatures in the range of 60° C. to 150° C. Films were prepared under working reaction pressures inside the deposition reactor of from 100 mtorr to 10 torr. The carrier gas was hydrogen at a flow rate ranging between 10 standard $cm^3$/min to 100 standard $cm^3$/min. Nitrogen was introduced as a reactant gas including a nitrogen-containing gas at a flow rate of 25 standard $cm^3$/min to 300 standard $cm^3$/min. Hydrogen was also provided to the CVD reaction zone as a reactant gas was at a flow rate ranging between 100 standard $cm^3$/min to 1000 standard $cm^3$/min. The substrate temperature ranged from 250° C. to 500° C. The films were deposited on silicon and silicon dioxide wafer substrates.

The tantalum nitride films produced were metallic, continuous, and mirror-like. The chemical composition of the films was examined by Auger electron spectroscopy using a physical Electronics Model 15-110B cylindrical mirror analyzer. The gold $f_{7/2}$ line at 83.8 eV was taken as a reference line and the analyzer was calibrated accordingly. All spectra were obtained using a pass energy of 23.5 eV. A primary electron energy of 5 keV at 1 mA was employed. The analysis chamber pressure was in the $10^{-9}$ torr range, and the results were standardized using a high-purity sputtered TaN sample. All samples were cleaned by sputtering before data acquisition. The choice of a standard of composition and chemical environment and bonding similar to that of the CVD films allowed high accuracy in Auger electron spectroscopy analysis. The results are based on the expectation that chemical and structural changes, if any, induced during the cleaning process are basically the same in the standard and plasma-promoted CVD films. FIG. 1 shows the Auger electron spectroscopy results which confirm that the samples are basically pure $TaN_{1.1}$ phase with contaminant levels below 2–3 at %.

Figure 2:
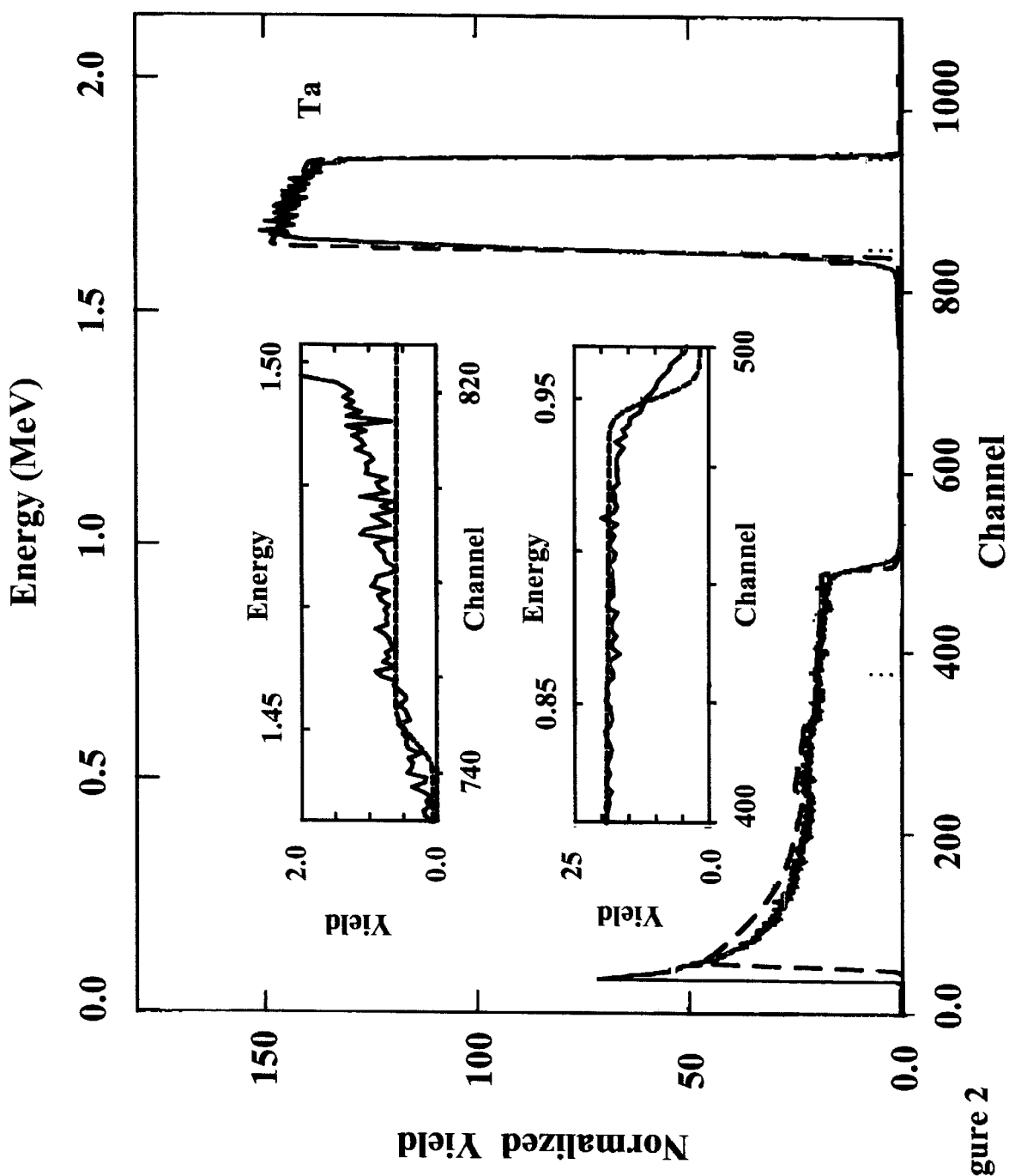
FIG. 2 is a representation of a Rutherford backscattering spectrum (RBS) of the tantalum nitride of Example 1.

Rutherford backscattering spectrometry spectra were also taken using a 2 MeV $He^+$ beam, and calibrated with a high-purity sputtered TaN film and a bulk sample of silicon. Rutherford backscattering measurements of the films are shown in FIG. 2 and confirm the Auger electron spectroscopy findings with respect to the purity of the $TaN_x$ films.

Figure 3:
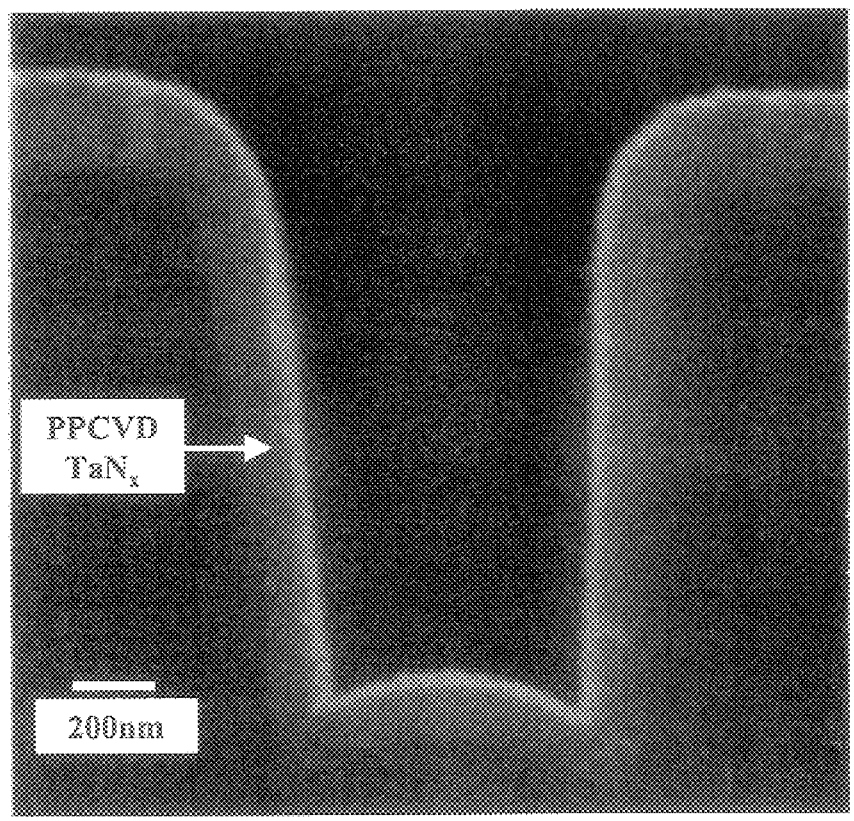
FIG. 3 cross section scanning electron microscope-magnified view of a silicon substrate upon which oxide via patterns, of nominal diameter 0.8 μm and 2 to 1 aspect ratio, are formed and upon which the conformal film of Example 1 has been deposited.
Figure 4:
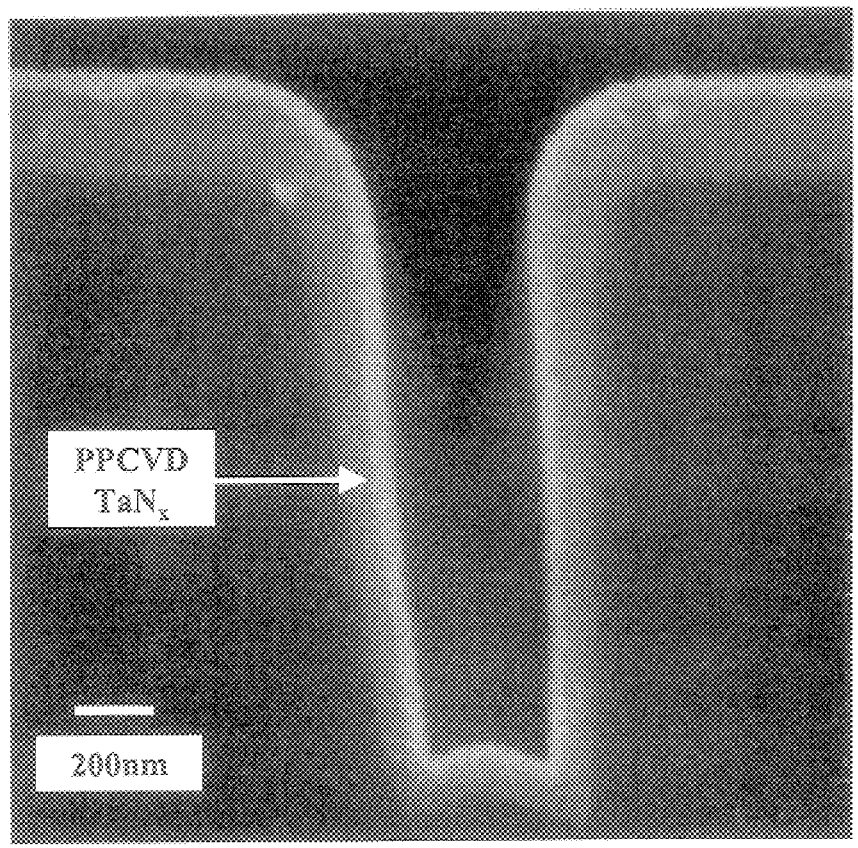
FIG. 4 is a cross section scanning electron microscope-magnified view of a silicon substrate upon which oxide via patterns, of nominal diameter 0.45 μm and 3 to 1 aspect ratio, are formed and upon which the conformal film of Example 6 has been deposited.

The nature of the tantalum nitride films with respect to the silicon substrates was also examined. The tantalum nitride films were observed to adhere well to either silicon or silicon dioxide. Cross-section scanning electron microscopy was carried-out on a Zeiss DSM940 microscope, employing a 20 keV primary electron beam and a beam current of 4 $\mu$A. FIG. 3 exhibits a cross-section scanning electron microscope-magnified view of a silicon substrate upon which oxide via patterns, of nominal diameter 0.8 micron and 2:1 aspect ratio, are formed and upon which a conformal tantalum nitride film has been deposited as described above. Similarly, FIG. 4 exhibits a cross-section scanning electron microscope-magnified view of a silicon substrate upon which oxide via patterns of nominal diameter 4.5 micron and a 4:1 aspect ratio, are formed and upon which a conformal tantalum nitride film has been deposited as described above.

Figure 5:
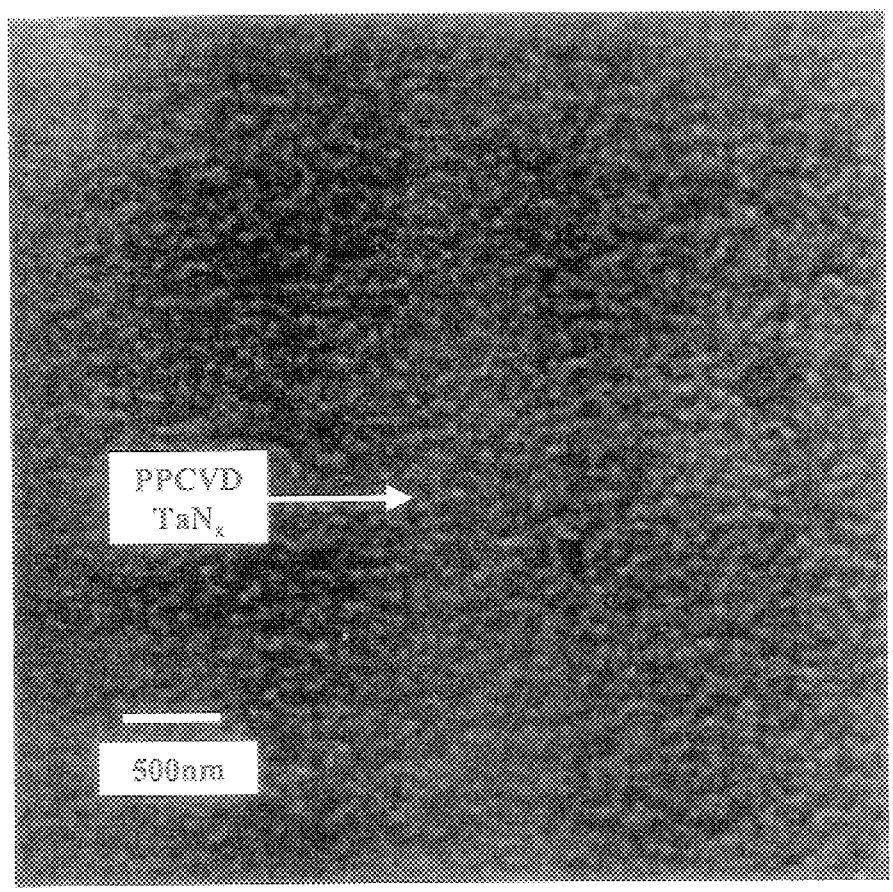
FIG. 5 is a scanning electron microscope-magnified view of the surface morphology of the tantalum nitride film of Example 1.

In addition, a scanning microscopy micrograph appears in FIG. 5 which shows the surface morphology of the tantalum nitride films deposited as described above. FIG. 5 supports the observation of a smooth surface morphology for a continuous tantalum nitride film.

EXAMPLE 2

Pure tantalum nitride films were prepared according to a thermal CVD method in a standard CVD deposition reactor chamber similar to the one described in Example 1. The source precursor was tantalum pentafluoride (TaF5) with sublimation temperatures in the range of 50° C. to 165° C. Films were prepared under working reactor pressures inside the deposition reactor of from 250 mtorr to 50 torr. No carrier gas was used. Instead, a commercial MKS type 1153 Solid Source Delivery System was employed to control the delivery of the tantalum pentafluoride ($TaF_5$) source in the vapor state at flows in the range of 1 standard cm$^3$/min to 25 standard cm$^3$/min. Ammonia was introduced as a reactant gas including a nitrogen-containing gas at a flow rate of 50 standard cm$^3$/min to 5000 standard cm$^3$/min. Hydrogen was used as additional reactant gas at a flow rate of 25 standard cm$^3$/min to 1000 standard cm$^3$/min. The substrate temperature ranged from 250° C. to 600° C. The films were deposited on silicon and silicon dioxide wafers.

Figure 6:
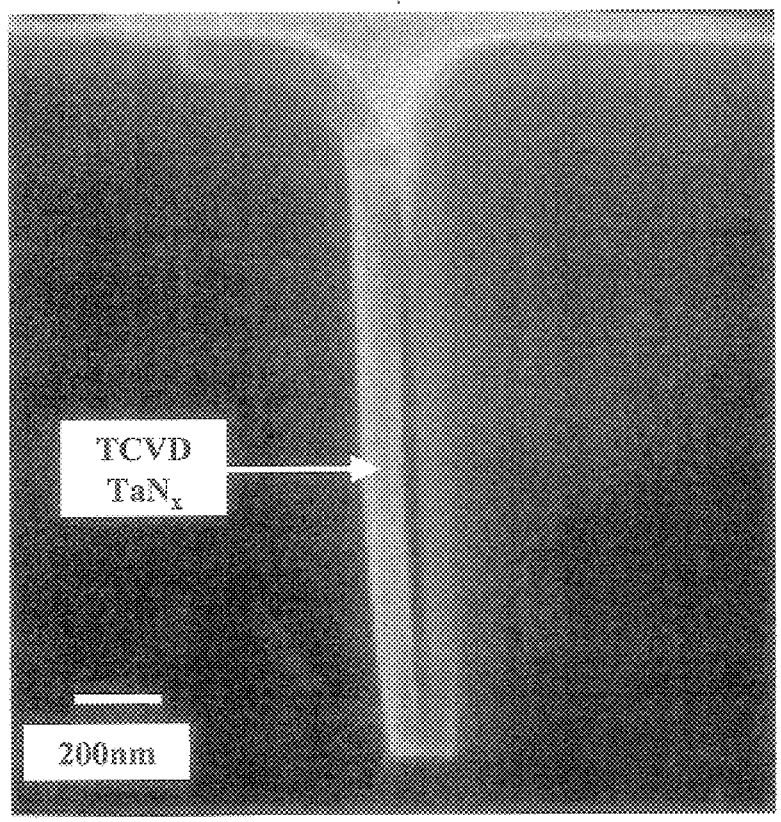
FIG. 6 is a cross section scanning electron microscope-magnified vie w of a silicon substrate upon which oxide via patterns, of nominal diameter 0.15 μm and 6:1 aspect ratio, are formed and upon which the conformal film of Example 2 has been deposited.

The tantalum nitride films produced were metallic, continuous and mirror-like. The chemical composition of the films was examined by Auger electron spectroscopy using the same system described in Example 1. The results were standardized using a high-purity sputtered TaN sample. All samples were cleaned by sputtering before data acquisition. The choice of a standard of composition and chemical environment and bonding similar to that of the CVD films allowed high accuracy in AES analysis. The results are based on the expectation that chemical and structural changes, if any, induced in the cleaning process were basically the same in the standard and thermal CVD films. Rutherford backscattering spectrometry spectra were also collected using the same system described in Example 1. The AES and RBS data indicated pure tantalum nitride films with contaminant incorporation being below the detection limits of the analytical techniques used. The nature of the tantalum nitride films with respect to the silicon substrates was also examined. The tantalum nitride films were observed to adhere well to silicon and silicon dioxide. Cross-section scanning electron microscopy, using the same scanning electron microscope described in Example 1 was also performed. FIG. 6 exhibits a cross section scanning microscope-magnified view of a silicon substrate upon which oxide via patterns, of nominal diameter 0.15 $\mu$m and 6 to 1 aspect ratio, are formed and upon which is a conformal tantalum nitride film formed as described above.

In contrast to various prior art chemical vapor deposition methods and as an alternative to methods using bromine or iodine-based source precursors, the method of the present invention provides films with electronic grade purity, due to the near or complete absence of carbon, oxygen, fluorine, or halide contamination. In contrast to sputtering techniques, the invention provides superior coverage of features intrinsic in microelectronic device manufacture.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for the chemical vapor deposition of a film comprising tantalum onto a substrate, comprising
   (a) introducing into a deposition chamber:
      (i) a substrate;
      (ii) a single source precursor comprising fluorine in a vapor state and having formula (I):

$$Ta(F_{5-q-p})(X_{q-p})(R_p) \qquad (I)$$

wherein X is selected from the group consisting of bromine, iodine, chlorine, and combinations thereof; q is an integer from 0 to 4; p is an integer from 0 to 4; and R is selected from the group consisting of hydrogen and lower alkyl; and
      (iii) a reactant gas; and
   (b) maintaining a temperature of said substrate within said chamber of from about 70° C. to about 675° C. for a period of time sufficient to react said single source precursor with said reactant gas and to deposit a film comprising tantalum on said substrate.

2. The method according to claim 1, wherein the reactant gas is selected from the group consisting of hydrogen, nitrogen, ammonia, hydrazine, and mixtures thereof.

3. The method according to claim 2, wherein said reactant gas is hydrogen.

4. The method according to claim 2, wherein the reactant gas further comprises helium.

5. The method according to claim 1, wherein step (a) further comprises introducing (iv) a carrier gas.

6. The method according to claim 5, wherein said at least one carrier gas is selected from the group consisting of hydrogen, helium, oxygen, fluorine, neon, chlorine, argon, krypton, xenon, carbon monoxide, carbon dioxide, ammonia, hydrazine, nitrous oxide, water vapor, and mixtures thereof.

7. The method according to claim 1, wherein a flow rate of said at least one reactant gas is greater than 0 and no greater than about 10 l/min.

8. The method according to claim 1, further comprising introducing into said chamber a plasma having a plasma power density of from about 0.01 W/cm$^2$ to about 10 W/cm$^2$ for a period of time sufficient to deposit a film comprising tantalum on the substrate.

9. The method according to claim 8, wherein said plasma has a frequency of from about 0 Hz to about $10^8$ kHz.

10. The method according to claim 1, further comprising applying an electrical bias to said substrate, wherein said electrical bias is at least one of a direct current bias, a low radio frequency bias of less than 500 kHz, a high radio frequency bias of from 500 kHz to $10^6$ kHz, or a microwave frequency bias of from $10^6$ kHz to about $10^8$ kHz bias.

11. The method according to claim 10, wherein said electrical bias has a power density greater than 0 Watts/cm$^2$ and less than or equal to about $10^3$ Watts/cm$^2$.

12. The method according to claim 11, wherein said electrical bias has a power density greater than 0.001 Watts/cm$^2$ and less than or equal to about 10 Watts/cm$^2$.

13. The method according to claim 1, wherein said substrate is a semiconductor substrate comprising a material selected from the group consisting of silicon, germanium, and gallium arsenide.

14. The method according to claim 1, wherein said substrate comprises a material selected from the group consisting of metal, glass, and polymer.

15. The method according to claim 14, wherein said substrate is a metal selected from the group consisting of aluminum, beryllium, cadmium, cerium, chromium, cobalt, copper, gallium, gold, lead, manganese, molybdenum, nickel, palladium, platinum, rhenium, rhodium, silver, steel, iron, strontium, tin, titanium, tungsten, zinc, zirconium, alloys thereof, and compounds thereof.

16. The method according to claim 1, wherein said temperature of said substrate within said chamber is maintained from about 250° C. to about 500° C.

17. The method according to claim 1, wherein said source precursor is tantalum pentafluoride.

18. The method according to claim 1, wherein
said film comprising tantalum is a pure tantalum film;
said reactant gas is hydrogen; and
said temperature of said substrate within said chamber is maintained from about 100° C. to about 675° C.

19. The method according to claim 18, wherein step (a) further comprises introducing (iv) a carrier gas selected from the group consisting of hydrogen, helium, oxygen, fluorine, neon, chlorine, argon, krypton, xenon, carbon monoxide, carbon dioxide, water vapor, and mixtures thereof.

20. The method according to claim 1, wherein
said film comprising tantalum is a TaSi$_y$ film, wherein y is greater than 0 and less than or equal to about 3;
step (a) further comprises introducing into said chamber:
(iv) a compound comprising silicon in a vapor state; and
said reactant gas is hydrogen.

21. The method according to claim 20, wherein step (a) further comprises introducing (v) a carrier gas selected from the group consisting of hydrogen, helium, oxygen, fluorine, neon, chlorine, argon, krypton, xenon, carbon monoxide, carbon dioxide, water vapor, and mixtures thereof.

22. The method according to claim 20, wherein said compound comprising silicon has formula (II):

$$Si(F_{4-r-s})(X_{r-s})(R_s) \qquad (II)$$

wherein r is an integer from 0 to 3, and s is an integer from 0 to 3.

23. The method according to claim 1, wherein
said film comprising tantalum is a TaN$_x$ film, wherein x is greater than 0 and less than or equal to about 2; and said reactant gas comprises a gas comprising nitrogen.

24. The method according to claim 23, wherein said gas comprising nitrogen is selected from the group consisting of ammonia, nitrogen, hydrazine, and mixtures thereof.

25. The method according to claim 23, wherein step (a) further comprises introducing (iv) a carrier gas selected from the group consisting of hydrogen, helium, oxygen, fluorine, neon, chlorine, argon, krypton, xenon, carbon monoxide, carbon dioxide, water vapor, nitrous oxide, ammonia, nitrogen, hydrazine, and mixtures thereof.

26. The method according to claim 1, wherein
said film comprising tantalum is a TaN$_x$Si$_y$ film, wherein x is greater than 0 and less than or equal to about 2 and y is greater than 0 and less than or equal to about 3; said reactant gas comprises a gas comprising nitrogen; and
step (a) further comprises introducing into said chamber:
(iv) a compound comprising silicon in a vapor state.

27. The method according to claim 26, wherein step (a) further comprises introducing (v) a carrier gas selected from the group consisting of hydrogen, helium, oxygen, fluorine, neon, chlorine, argon, krypton, xenon, nitrogen, ammonia, hydrazine, nitrous oxide, carbon monoxide, carbon dioxide, water vapor, and mixtures thereof.

28. The method according to claim 26, wherein said compound comprising silicon has formula (II):

$$Si(F_{4-r-s})(X_{r-s})(R_s) \qquad (II)$$

wherein r is an integer from 0 to 3, and s is an integer from 0 to 3.

29. The method according to claim 1, further comprising:
(c) depositing a second film comprising tantalum on said film deposited on said substrate for forming a multilayered structure while said substrate remains fixed in said chamber, wherein said second film comprising tantalum is selected from the group consisting of a pure tantalum film, a TaN$_x$ film, wherein x is greater than 0 and less than or equal to about 2; a TaSi$_y$ film, wherein y is greater than 0 and less than or equal to about 3; and a TaN$_x$Si$_y$ film, wherein x is greater than 0 and less than or equal to about 2 and y is greater than 0 and less than or equal to about 3.

30. The method according to claim 1, wherein said substrate comprises silicon; and said method further comprises:
(c) heating said substrate and said deposited film comprising tantalum to a temperature of from about 700° C. to about 950° C. for providing silicon to said deposited film comprising tantalum.

* * * * *

Adverse Decision In Interference

Patent No. 6,139,922, ALAIN E. KALOYEROS, BARRY C. ARKLES, TANTALUM AND TANTALUM-BASED FLMS FORMED USING FLUORINE-CONTAINING SOURCE PRECURSORS AND METHODS OF MAKING THE SAME, Interference No. 105,161, final judgment adverse to the patentees rendered, November 30, 2004 as to claims 1-19, 23-25.

*(Official Gazette January 18, 2005)*